(12) United States Patent
Gaidis et al.

(10) Patent No.: US 8,951,811 B2
(45) Date of Patent: Feb. 10, 2015

(54) MAGNETIC DOMAIN WALL SHIFT REGISTER MEMORY DEVICE READOUT

(71) Applicant: International Business Machines Corporation, Armonk, NY (US)

(72) Inventors: Michael C. Gaidis, Wappingers Falls, NY (US); Alexander J. Gaidis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/970,764

(22) Filed: Aug. 20, 2013

(65) Prior Publication Data

US 2014/0141530 A1 May 22, 2014

Related U.S. Application Data

(63) Continuation of application No. 13/682,063, filed on Nov. 20, 2012, now Pat. No. 8,772,889.

(51) Int. Cl.
*H01L 43/12* (2006.01)
*H01L 43/08* (2006.01)
*B82Y 99/00* (2011.01)

(52) U.S. Cl.
CPC .............. *H01L 43/12* (2013.01); *H01L 43/08* (2013.01); *B82Y 99/00* (2013.01)
USPC .......................................................... 438/3

(58) Field of Classification Search
CPC ......... H01L 43/08; H01L 43/12; H01L 27/22; H01L 27/222; B82Y 99/00
USPC .................................... 438/3; 428/827, 828, 1
See application file for complete search history.

(56) References Cited

U.S. PATENT DOCUMENTS

| | | | |
|---|---|---|---|
| 7,061,037 B2 | 6/2006 | Ju et al. | |
| 7,285,836 B2 | 10/2007 | Ju et al. | |
| 7,502,244 B2 | 3/2009 | Cowburn | |
| 7,652,915 B2 | 1/2010 | Folks et al. | |
| 7,710,769 B2 | 5/2010 | Cowburn et al. | |
| 7,710,770 B2 | 5/2010 | Cowburn et al. | |
| 7,936,597 B2 | 5/2011 | Clinton et al. | |
| 8,009,453 B2 | 8/2011 | Gaidis et al. | |
| 8,023,305 B2 | 9/2011 | Gaidis et al. | |
| 8,124,426 B2 | 2/2012 | Gaidis | |
| 8,164,940 B2 | 4/2012 | Ozatay et al. | |
| 8,238,150 B2 * | 8/2012 | Ohmori ......................... | 365/171 |
| 2004/0150043 A1 * | 8/2004 | Holm et al. .................... | 257/347 |

(Continued)

FOREIGN PATENT DOCUMENTS

| | | |
|---|---|---|
| EP | 2016592 B1 | 9/2009 |
| JP | 2010528455 A | 8/2010 |

OTHER PUBLICATIONS

A.J. Annunziata et al., "Racetrack Memory Cell Array with Integrated Magnetic Tunnel Junction Readout," Electron Devices Meeting (IEDM), 2011 IEEE International, vol. no., pp. 24.3.1-24.3.4, Dec. 5-7, 2011.

(Continued)

*Primary Examiner* — Nikolay Yushin
(74) *Attorney, Agent, or Firm* — Cantor Colburn LLP; Vazken Alexanian (57) ABSTRACT

A memory device includes a first nanowire, a second nanowire and a magnetic tunnel junction device coupling the first and second nanowires.

4 Claims, 12 Drawing Sheets

(56) References Cited

U.S. PATENT DOCUMENTS

2008/0164548 A1* 7/2008 Ranjan et al. .............. 257/421
2010/0124091 A1   5/2010 Cowburn
2010/0128510 A1   5/2010 Cowburn
2013/0249024 A1   9/2013 Saida et al.
2013/0334631 A1* 12/2013 Kinney et al. .............. 257/421

OTHER PUBLICATIONS

L. THomas et al., "Racetrack Memory: a High-Performance, Low-Cost, Non-Volatile Memory Based on Magnetic Domain Walls," Electron Devices Meeting (IEDM), 2011 IEEE International, vol., no., pp. 24.2.1-24.2.4, Dec. 5-7, 2011.

* cited by examiner

MAGNETIC DOMAIN WALL SHIFT REGISTER MEMORY DEVICE READOUT

CROSS-REFERENCE TO RELATED APPLICATION

This application is a continuation of U.S. patent application Ser. No. 13/682,063, filed Nov. 20, 2012, the disclosure of which is incorporated by reference herein in its entirety.

BACKGROUND

The present invention relates to magnetic domain wall shift register memory devices, and more specifically, to a magnetic domain wall shift register memory device utilizing compactly stacked self-referencing magnetic tunnel junctions (MTJs) having improved readout characteristics.

Magnetic domain wall shift register memory, often referred to as racetrack memory (RTM), is a non-volatile magnetic memory device which utilizes magnetic domains to store data in a ferromagnetic nanowire configured as a shift register. Multiple magnetic domains, separated by domain walls, are shifted through the nanowire by short pulses of spin-polarized current along the nanowire. Data is stored in the magnetic polarization of the domains, which can be set by an injector such as a field-generating wire or a spin-torque-transfer device. One method of reading the data senses domain polarization with a magnetic tunnel junction (MTJ) adjacent to the magnetic nanowire. Arrays of nanowires oriented parallel to the substrate comprise "in-plane" racetrack memory (iRTM). iRTM offers a relatively dense alternative to other memories such as magnetoresistive random access memory (MRAM), flash, SRAM, phase change memory (PCM), and DRAM, with the added benefits of endurance and non-volatility.

State of the art iRTM includes one write and one read device per planar domain wall shift register track. The prior art details ways to stack layers of iRTM atop each other for higher memory density through better use of underlying silicon area. To allow for shifting domain walls and reading domains in a given plane of iRTM, stacked iRTM must locate transistors at the end of each track so that single tracks can be independently shifted and read. So, while the iRTM can be made denser through stacking, there is still a difficulty with densely packing transistors near the ends of the racetrack wires.

At present, other forms of memory may be more cost-effective and optimize area more efficiently than a single plane of iRTM. One contemplated solution is vertical racetrack memory (vRTM), which provides higher density memory through vertical orientation of the shift-register nanowires. However, vRTM has fabrication complexity that makes vRTM a currently unavailable solution.

SUMMARY

Exemplary embodiments include a memory device, including a first nanowire, a second nanowire and a magnetic tunnel junction device coupling the first and second nanowires.

Further exemplary embodiments include a method of fabricating a memory device, including depositing and forming a common reference layer on a first racetrack film, depositing a dielectric encapsulation on the reference layer and depositing a second racetrack film on the dielectric encapsulation.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In exemplary embodiments, the systems and methods described herein include a magnetic domain wall shift register memory device utilizing MTJs that are configured for compact stacking of the shift-register nanowires, and are configured for improved readout characteristics to enable lower perturbation of the nanowires by the MTJ readout structure and to enable a self-referencing scheme for lower-noise readout. In exemplary embodiments, a magnetic domain wall shift register memory device includes a multitude of nanowires and magnetic reference layers disposed on the nanowires. In exemplary embodiments, the reference layer of the magnetic domain wall shift register memory device is shared between stacked domain wall nanowires for improved array density. In other exemplary embodiments, the magnetic domain wall shift register memory device implements a common reference element for all shift register nanowires in the planar array, and can also implement a multi-domain reference layer to enable self-reference operation. It will be appreciated that the systems and methods described herein provide an intermediate step towards vRTM by vertically stacking iRTM, which adds layer upon layer of in-plane (horizontally-oriented) nanowires to increase density without dramatic increase of fabrication complexity.

The exemplary magnetic domain wall memory apparatus with MTJs described herein provide readout shared between two layers of horizontally-oriented stacked iRTMs. The readout of a given plane of iRTM can be further enhanced in exemplary embodiments through the use of extended-length reference electrodes that span the width of an iRTM array to reduce the fringing field from the readout reference electrode. In addition, enhanced readout accuracy is achieved through a racetrack-like reference electrode with alternating domain wall polarization spanning the width of an iRTM array and capable of being shifted across the readout MTJs to create a self-referencing output signal.

Figure 1A:
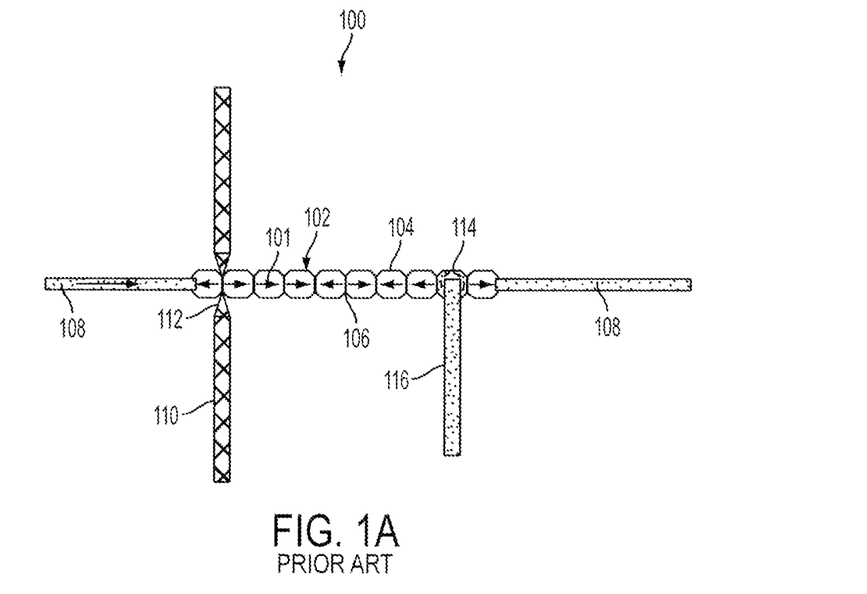
FIG. 1A illustrates a schematic top view of a conventional single magnetic domain wall shift register structure.
Figure 1B:
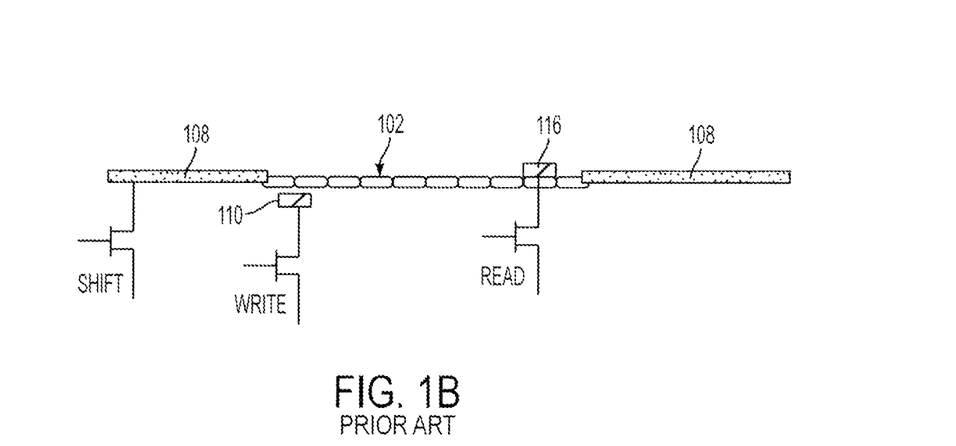
FIG. 1B is a schematic cross-sectional view of the shift register of FIG. 1A.

FIG. 1A illustrates a schematic top view of a conventional single magnetic domain wall shift register structure 100, illustrating the general principle of memory storage and shifting. FIG. 1B is a schematic cross-sectional view of the shift register 100 of FIG. 1A, particularly illustrating connections to the front-end CMOS shift, read and write control circuitry. The shift register structure 100 includes a thin track 102 made of a ferromagnetic material. The track 102 may be magnetized in small domains or sections 104, in one direction or another, as indicated by arrows 101. Bits are stored within the track 102 based on the presence or absence of domain walls, which are located and detected at, for example, notches 106 in the thin magnetic track 102. However, other characteristics may also be used to define individual domain boundaries such as, for example, physical overlapping of magnetic segments, varying layer thicknesses (e.g., by partially etching back or partially plating up every other domain), or using alternating types of magnetic materials in the track 102. As such, domain boundaries for storing individual bits can be formed by physical discontinuities (e.g., notches) or by material discontinuities. For certain choices of nanowire materials and circuitry, domain boundaries will be adequately stable without need for any such discontinuities.

Data within the register 100 is shifted through the application of current through a wire 108 connected at opposite ends of the track 102. Depending upon the duration of the applied polarized electron current, a force is imparted that is capable of shifting the domain walls from one notch to an adjacent notch. In the example of FIG. 1A, the direction of the applied electron flow causes the data to shift one position to the right. Unless measures are taken to capture the data (the data at the rightmost domain is shifted off the track 102), that bit will be lost.

A write element positioned at one end of the shift register 100 includes a conductor or wire 110 having an optional constriction 112 (i.e., a narrow portion) formed therein corresponding to a domain 104 or a domain boundary (notches 106). Although FIGS. 1A and 1B shows the write wire 110 positioned beneath a domain boundary, the wire may also be positioned beneath a domain instead. The write element wire 110 carries a current orthogonal to the magnetic memory element, with the resulting magnetic field being magnified at the constriction 112 in order to facilitate writing of the domain wall. In addition, a read element 114 is positioned at the opposite side of the shift register 102 with respect to the write element. In the example illustrated, the read element 114 is embodied by an MTJ. As indicated above, in order to maintain data in the shift register 100, a closed-loop shift register may be created by feeding back "read" data to the write element as the data in the shift register 102 is shifted by the application of current through wire 108. A read wire 116 is also coupled to the MTJ 114.

Figure 2A:
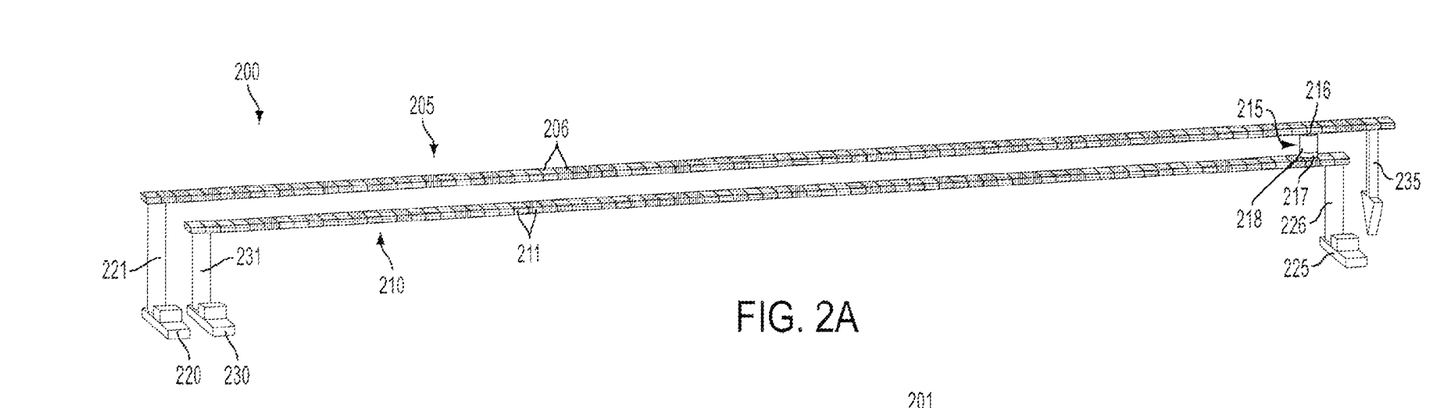
FIG. 2A illustrates a schematic perspective view of an exemplary stacked iRTM apparatus.
Figure 2B:
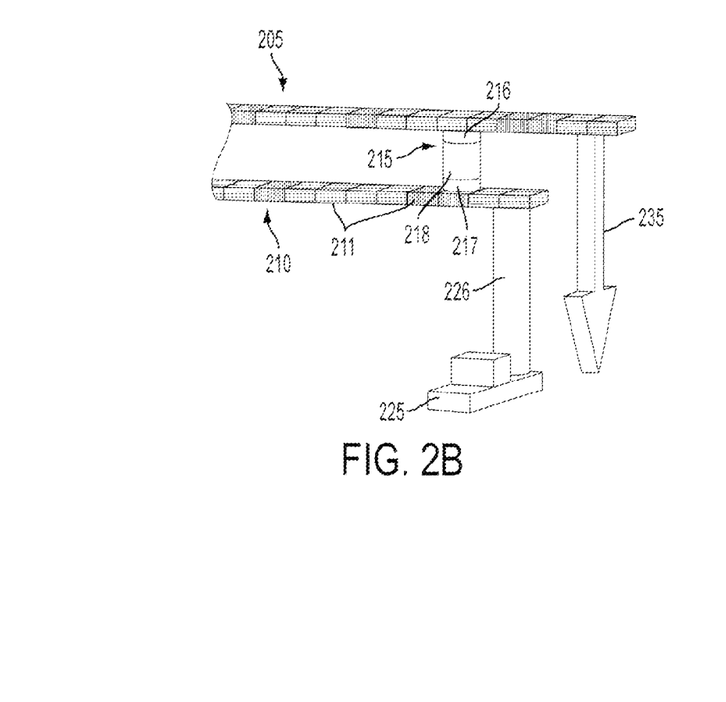
FIG. 2B illustrates another schematic perspective view of an exemplary stacked iRTM apparatus of FIG. 2A.
Figure 2C:
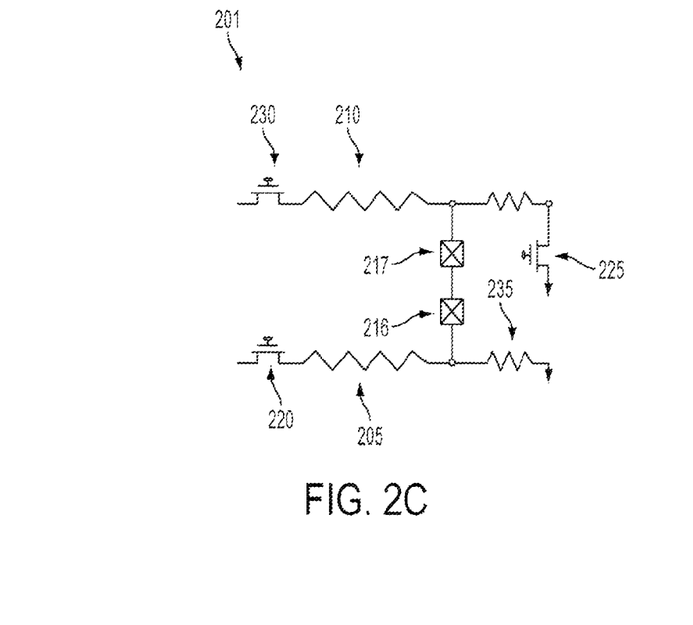
FIG. 2C is a schematic circuit diagram 201 of the iRTM apparatus of FIGS. 2A-2B.

FIG. 2A illustrates a schematic perspective view of an exemplary stacked iRTM apparatus 200. FIG. 2B illustrates another schematic perspective view of an exemplary stacked iRTM apparatus 200, and FIG. 2C is a schematic circuit diagram 201 of the iRTM apparatus 200. The apparatus 200 includes a first nanowire 205 and a second nanowire 210. As described herein, the nanowires (tracks) 205, 210 may be magnetized in small domains or sections 206, 211, in one direction or another. An MTJ element 215 is disposed between the nanowires 205, 210 and is configured to read signals from both nanowires 205, 210 as current is passed through the two nanowires 205, 210 and the domains 206, 211 are shifted. In exemplary embodiments, the MTJ element 215 includes two MTJs 216, 217 (e.g., magnesium oxide ($MgO_x$)), one for each nanowire 205, 210. A fixed direction magnet (reference magnetic layer) 218 is disposed between the MTJs 216, 217 for reading the signals from the nanowires 205, 210.

In exemplary embodiments, the apparatus 200 further includes a shift transistor 230 for the nanowire 210, and connected to the nanowire 210 via a conductor 231, and a readout transistor 220 for the nanowire 205, and connected to the nanowire 205 via a conductor 221. The apparatus 200 further includes a shift transistor 225 for the nanowire 210, and connected to the nanowire 210 via a conductor 226. Transistor 225 shunts current to ground when shifting domains in nanowire 210 through transistor 230. The readout transistor 230 also functions as a readout transistor for the nanowires 205 and 210. The apparatus 200 includes a ground connector 235 attached to nanowire 205. During the read operation, the transistor 225 is held open such that a read current applied through transistor 230 passes through the entire MTJ element 215.

As such, FIGS. 2A-2C illustrate an example of two stacked iRTM nanowires with readout by a single element containing an upper and a lower magnetic tunnel junction. In contrast to conventional iRTMs, only one transistor is added to control the readout of the two nanowires (i.e., conventional iRTMs using one transistor for each of the magnetic tunnel junctions). An injection mechanism is not shown for clarity, but would be similar to conventional injection mechanisms. It can include elements described in the prior art such as, but not limited to, field-generating wires or spin-torque-transfer devices. In the example, domains in the nanowire 205 are shifted by applying a voltage Vshift to the transistor 220, and turning on the transistor 220 to allow current to flow through the nanowire 205 to the ground connector 235. MTJs 216, 217 can be fabricated with significantly large resistance that the small resistances from the tails of the nanowires 205 and 210 are negligible, and no substantial current flows through the MTJs 216 and 217 during the shift operation.

In the example, to shift domains in the nanowire 210, the upper transistors 225, 230 are turned on and a shift voltage is applied to pass current through the transistor 230 and nanowire 210 and transistor 225 to ground. The MTJs 216, 217 are of suitably large resistance compared to the transistor 225, so current flows primarily through the transistor 225 and a negligible amount flows through the MTJs 216, 217 to the ground connection 235. To shift domains in the nanowire 205, transistor 220 is turned on and a shift voltage is applied to pass current through transistor 220 and nanowire 205 to ground 235. To read the state of the two nanowires 205, 210, the transistors 225, 220 are open-circuited and a relatively small read voltage is applied to pass current through the "on" transistor 230. The current flows through the two MTJs 216, 217 to the ground connection 235.

In exemplary embodiments, when reading the stacked nanowire states, there are four possible combinations of resistances that can be read, depending on the magnetization direction of the domains in the nanowires 205, 210 relative to the magnetization direction of the fixed direction magnet 218. The two tunnel junctions 216, 217 are made with different barrier thickness or size such that the four possible domain magnetization configurations from the nanowires 205, 210 result in four resolvable resistance values being read by the sense circuitry.

In exemplary embodiments, multiple stacks (i.e., additional nanowires and MTJs) are contemplated. It can be appreciated that the apparatus 200 and variations thereof utilize area by stacking nanowires and reducing the number of CMOS transistors per bit, providing an increase in the memory density. The example described herein runs two racetracks (i.e., the nanowires 205, 210) with three transistors 220, 225, 230) whereas in conventional devices, two transistors are implemented to drive a single racetrack.

Figure 3A:
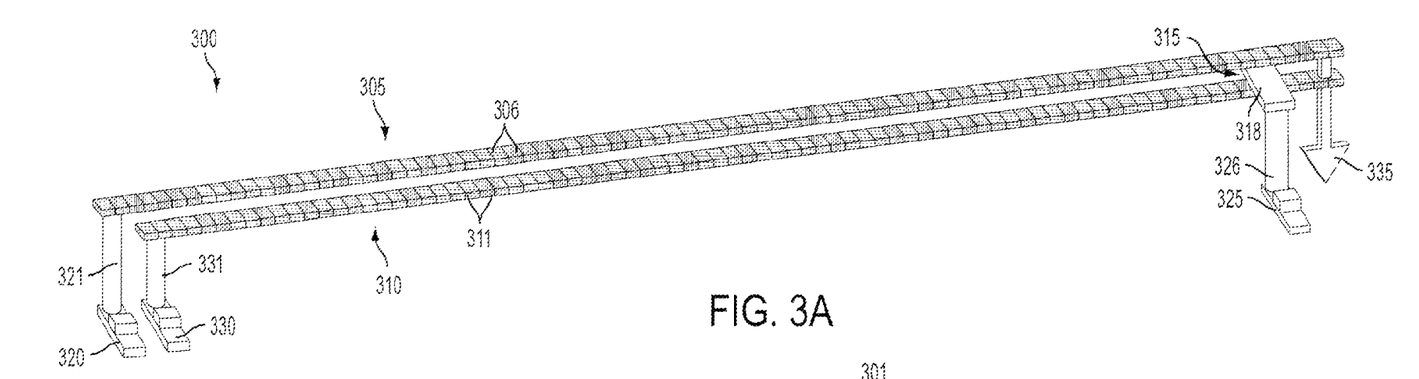
FIG. 3A illustrates a schematic perspective view of an exemplary stacked iRTM apparatus.
Figure 3B:
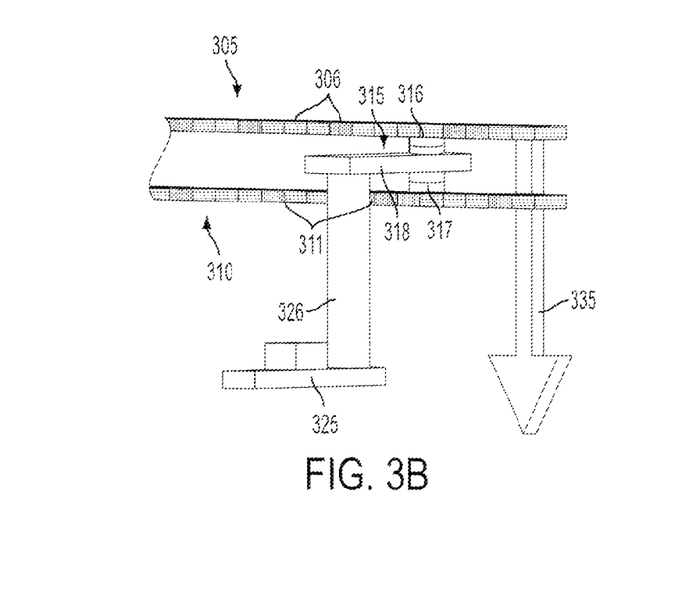
FIG. 3B illustrates another schematic perspective view of an exemplary stacked iRTM apparatus of FIG. 3A.
Figure 3C:
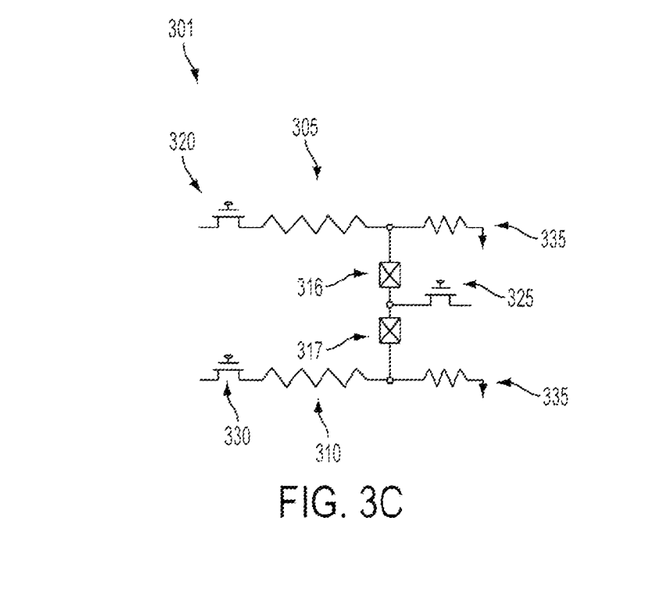
FIG. 3C is a schematic circuit diagram 301 of the iRTM apparatus of FIGS. 3A-3B.

FIG. 3A illustrates a schematic perspective view of an exemplary stacked iRTM apparatus 300. FIG. 3B illustrates another schematic perspective view of an exemplary stacked iRTM apparatus 300, and FIG. 3C is a schematic circuit diagram 301 of the iRTM apparatus 300. FIGS. 3A-3C illustrates a variation in which the readout is balanced and the parallel combination tunnel junctions in a shared MTJ structure is measured to determine the state of the two racetracks surrounding the MTJ structure.

The apparatus 300 includes a first nanowire 305 and a second nanowire 310. As described herein, the nanowires (tracks) 305, 310 may be magnetized in small domains or sections 306, 311, in one direction or another. An MTJ element 315 is disposed between the nanowires 305, 310 and is configured to read signals from both nanowires 305, 310 as current is passed through the two nanowires 305, 310 and the domains 306, 311 are shifted. In exemplary embodiments, the MTJ element 315 includes two MTJs 316, 317 (e.g., $MgO_x$), one for each nanowire 305, 310. A fixed direction magnet 318 is disposed between the MTJs 316, 317 for reading the signals from the nanowires 305, 310. In this example, as described further herein, the fixed direction magnet (reference magnetic layer) 318 is extended and connected to a connector 326 for a readout transistor 325.

In exemplary embodiments, the apparatus 300 further includes a readout transistor 325 for the nanowire 305, and connected to the nanowire 305 through a conductor 326, conductor reference layer 318, and MTJ 316. The readout transistor 325 also samples in parallel the state of nanowire 310 through conductor 326, conductor reference layer 318, and MTJ 317. The apparatus 300 further includes a shift transistor 320 for the nanowire 305, and connected to the nanowire 305 via a conductor 321. In addition, the apparatus 300 includes a shift transistor 330 for the nanowire 310, and connected to the nanowire 310 via a conductor 331. The apparatus 300 includes a ground connection 335 for termination of shift and read currents originating with transistors 320, 330, or 325. The ground connector 335 is connected to both the nanowires 305, 310, creating a parallel configuration.

As such, FIGS. 3A-3C illustrate an example of two stacked iRTM nanowires with readout by a single element containing an upper and a lower magnetic tunnel junction. In contrast to conventional iRTMs, only one transistor is added to control the readout of the two nanowires (i.e., conventional iRTMs use one transistor for each of the magnetic tunnel junctions). An injection mechanism is not shown for clarity, but would be similar to conventional injection mechanisms. It can include elements described in the prior art such as, but not limited to, field-generating wires or spin-torque-transfer devices. In the example, domains in the nanowire 305 are shifted by applying a voltage Vshift to the transistor 320, and turning on the transistor 320 to allow current to flow through the nanowire 305 to the ground connector 335. MTJs 316, 317 can be fabricated with significantly large resistance that the small resistances from the tails of the nanowires 305 310 are negligible, and no substantial current flows through the MTJs 316, 317 during the shift operation. As such, FIGS. 3A-3C illustrate an exemplary parallel MTJ configuration.

In the example, to shift domains in the nanowire 310, the transistor 330 is turned on and a shift voltage is applied to the transistor 330. The MTJs 316, 317 are of suitably large resistance compared to the tail of the nanowire, so current flows primarily through the tail of the nanowire to the ground connection 335. To read the state of the two nanowires 305, 310, both shift transistors are open, and read transistor 325 is turned on. A read voltage applied to transistor 325 makes current flow in parallel through the two MTJs 316, 317 to the ground connection 335. Different MTJ resistance values for the MTJs 316, 317 lead to four different resistance states depending on the state of the racetrack domains above and below the double-MTJ element 315 (e.g., up-up, up-down, down-up, and down-down polarizations for the domains adjacent to the MTJ element 315). The fixed direction magnet 318 is a reference magnetic layer against which the racetrack domains are compared.

In exemplary embodiments, a similar parallel MTJ such as the example illustrated in FIGS. 3A-3C can be additionally implemented at the injection region of the nanowires, 305 and 310, as a compact way of injecting domain walls into stacked racetrack nanowires with a common reference element using spin-torque-transfer for domain switching. The "injection region" refers to the side of the nanowire opposite the readout structure. Transistor configurations and applied currents and voltages are such that they will pass current through the injection element in either a positive or negative direction to inject domain walls of the two polarities, and forms a compact structure for writing domains to two separate nanowires with a common reference element.

Figure 4A:
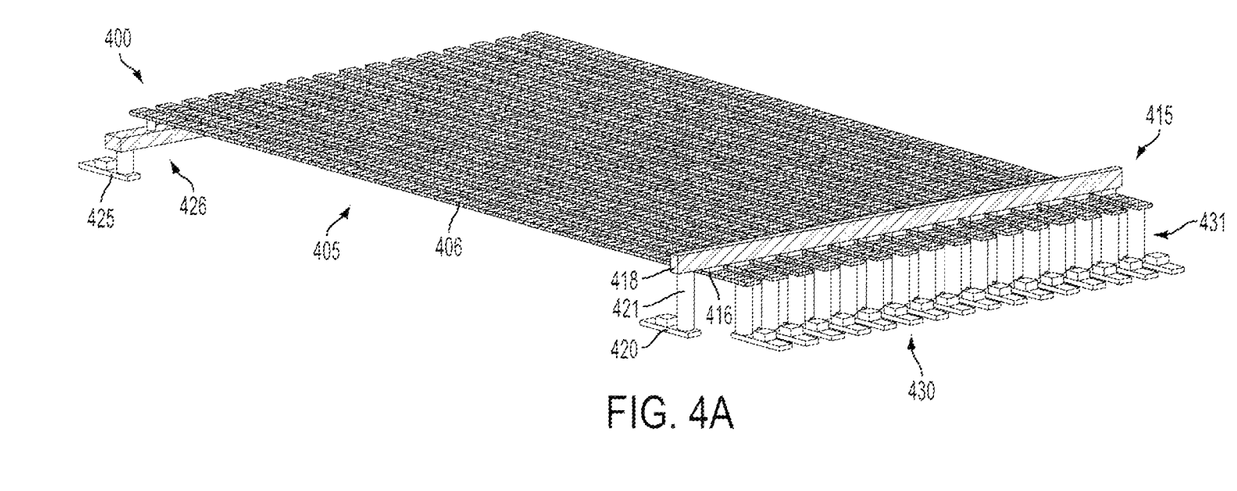
FIG. 4A illustrates a schematic perspective view of an exemplary in-plane racetrack nanowire array.
Figure 4B:
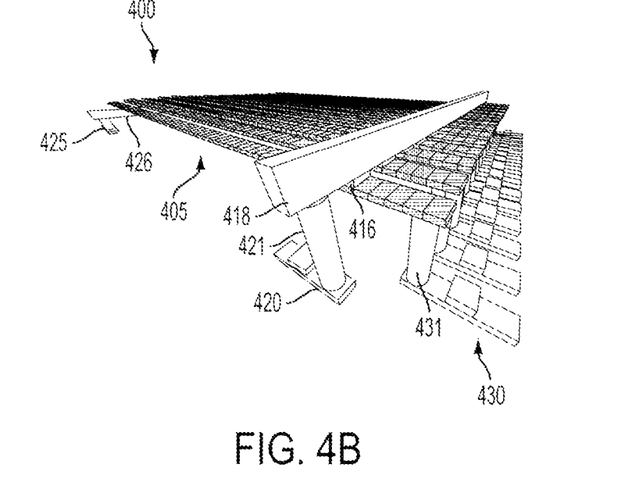
FIG. 4B illustrates another schematic perspective view of an exemplary in-plane racetrack nanowire array of FIG. 4A.
Figure 4C:
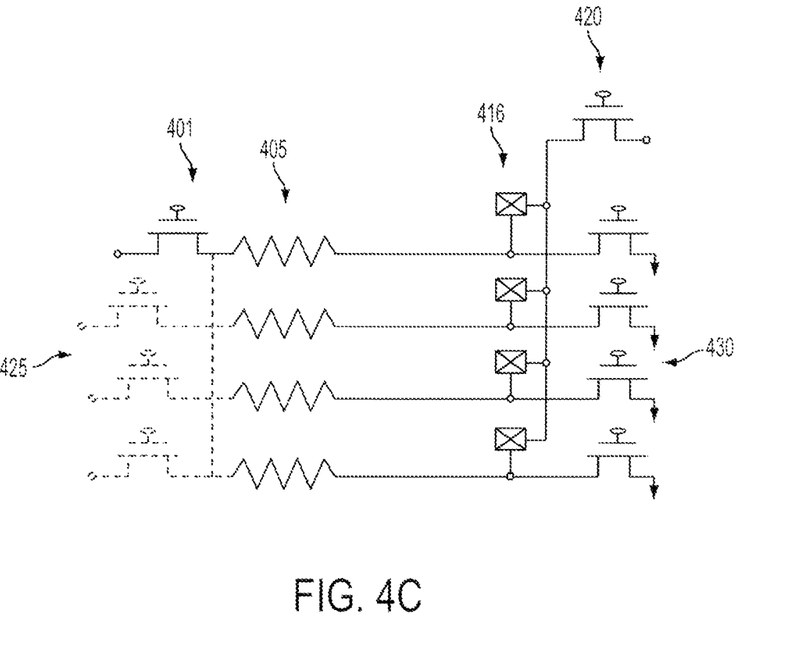
FIG. 4C is a schematic circuit diagram 401 of the exemplary in-plane racetrack nanowire array of FIGS. 4A and 4B.

FIG. 4A illustrates a schematic perspective view of an exemplary in-plane racetrack nanowire array 400. FIG. 4B illustrates another schematic perspective view of an exemplary in-plane racetrack nanowire array 400, and FIG. 4C is a schematic circuit diagram 401 of the exemplary in-plane racetrack nanowire array 400. The array 400 implements an extended common reference electrode for an entire array of iRTM nanowire elements. The array 400 includes a number of in-plane nanowires, collectively illustrated as nanowires 405. As described herein, the nanowires (tracks) 405 may be magnetized in small domains or sections 406 in one direction or another. MTJ elements collectively shown as MTJ elements 415 are disposed above the nanowires 405 and are configured to read signals from the nanowires 405 as current is passed through the nanowires 405 and the domains 406 are shifted. In another exemplary embodiment, the MTJ elements 415 would be disposed beneath the nanowires 405. In exemplary embodiments, the MTJ elements 415 include a single MTJ 416 (e.g., MgOx) one for each of the nanowires 405. A fixed direction magnet (reference magnetic layer) 418 is disposed on and common to MTJs 416 for reading the signals from the nanowires 405.

In exemplary embodiments, the array 400 further includes a readout transistor 420 for reading the nanowires 405, and connected to the nanowires 405 via a conductor 421, which is connected to the fixed direction magnet 418. The array 400 further includes a first set of shift transistors 425 shown as a single transistor for illustrative purposes, and connected to the nanowires 405 via a conductor set 426. The array 400 also includes a second set of shift transistors 430, illustrated as multiple transistors for illustrative purposes. The shift transistors 430 are connected to the nanowires 405 via a set of conductors 431. It will be appreciated that each set of shift transistors 425, 430 can be multiple transistors or a single transistor connected to all nanowires 405 in parallel, depending on desired circuit configuration.

As such, FIGS. 4A-4C illustrate an array of in-plane racetrack nanowires with individual magnetic tunnel junctions for readout of each nanowire. The single fixed direction magnet (reference magnetic layer) 418 is coupled to all the MTJs 416 in the array 400. The write or read operation (injector not shown, for clarity) is completed with a shift action driven by one or more transistors 425, 430, depending on how many nanowires 405 are being shifted and in which directions. In exemplary embodiments, the read takes place by opening the shift transistors 425, and closing the shift transistors 430 to ground along with the read transistor 420 to connect the fixed direction magnet (reference magnetic layer) 418 to a read voltage. For suitably high nanowire resistance relative to MTJ barrier resistance, a single transistor can be used to control shifting of domains in all racetracks simultaneously. For lower-resistance nanowires, individual transistors are used to eliminate sneak paths that dilute the read signal from any one particular MTJ/nanowire combination. In exemplary embodiments, substantially fewer transistors are needed per array if sneak paths can be avoided and a single shift transistor 425 is implemented for shifting. The array 400 has magnetic behavior in the fixed direction magnet (reference magnetic layer) 418, which is now described. For in-plane magnetization, the elongated fixed direction magnet (reference magnetic layer) 418 has substantially lower demagnetization fields than individual reference elements of size similar to the racetrack wire width. The lower demagnetization field imparts lower disturbance on the nanowire elements as they are shifted beneath the MTJ tunnel barriers, and thus results in fewer issues with "sticky" bits that do not flow smoothly past the MTJ during shift operations.

Figure 5A:
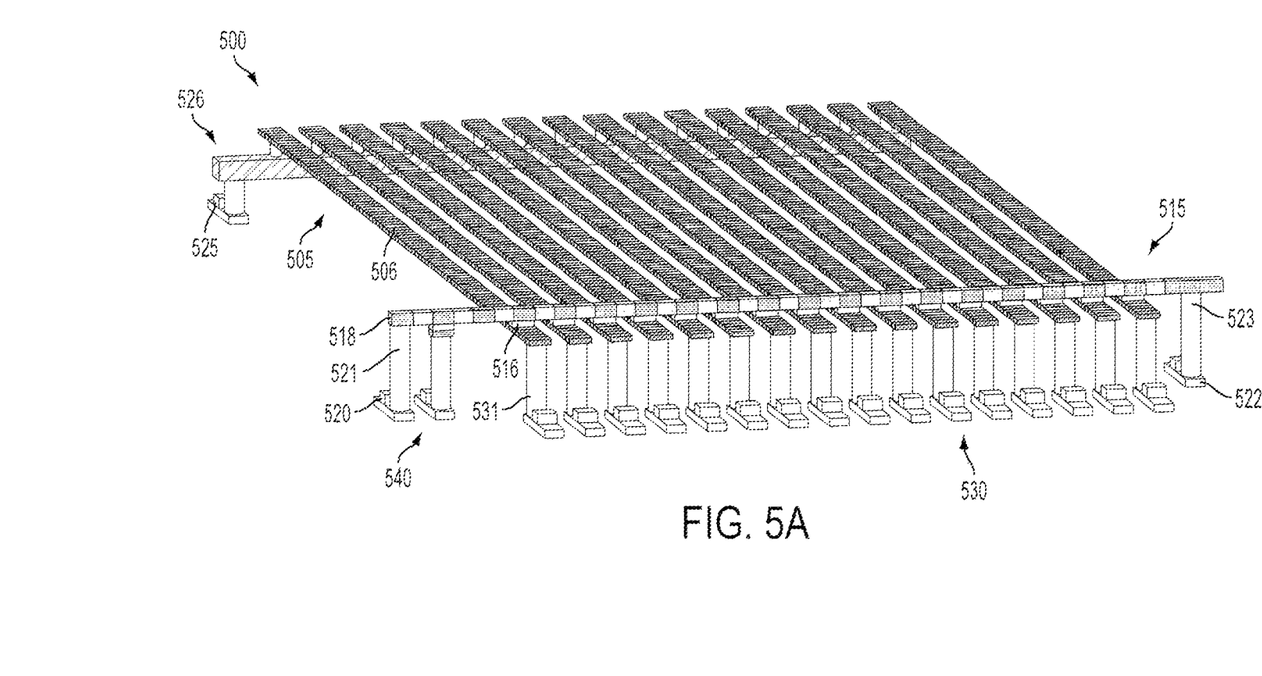
FIG. 5A illustrates a schematic perspective view of another exemplary in-plane racetrack nanowire array.
Figure 5B:
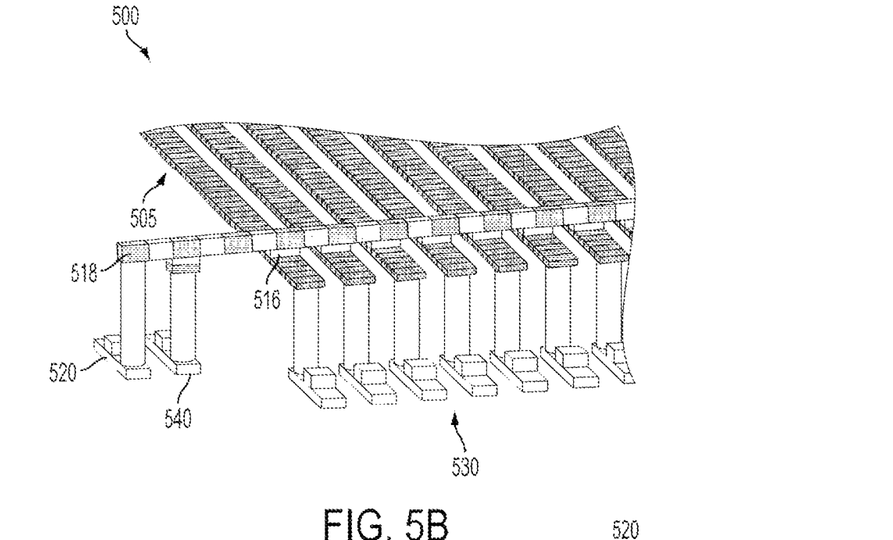
FIG. 5B illustrates another schematic perspective view of an exemplary in-plane racetrack nanowire array of FIG. 5A.
Figure 5C:
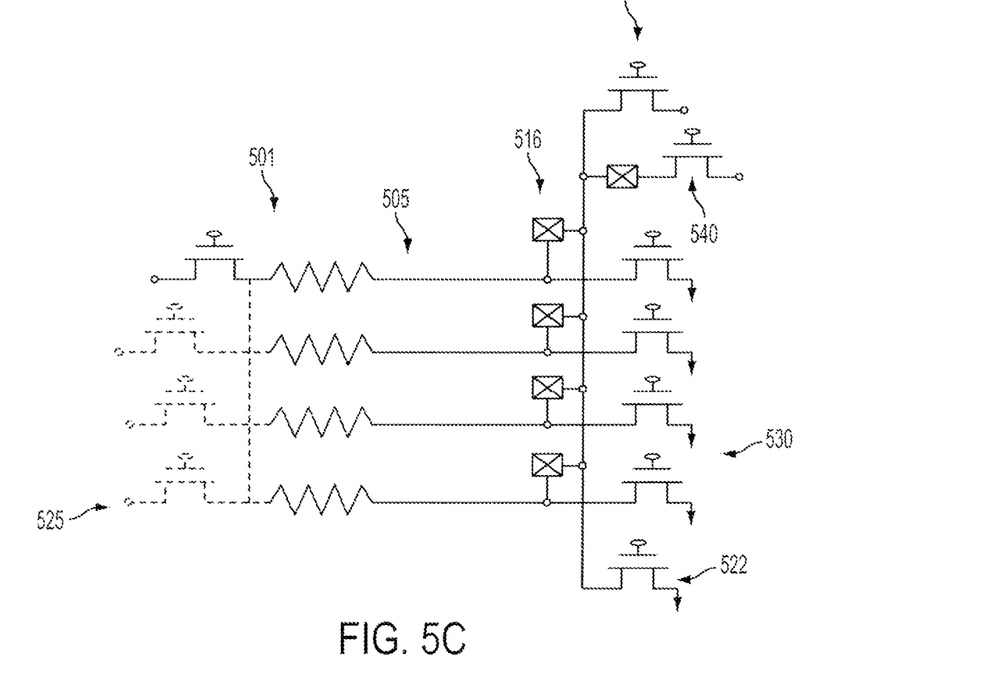
FIG. 5C is a schematic circuit diagram 501 of the exemplary in-plane racetrack nanowire array of FIGS. 5A and 5B.

FIG. 5A illustrates a schematic perspective view of another exemplary in-plane racetrack nanowire array 500. FIG. 5B illustrates another schematic perspective view of an exemplary in-plane racetrack nanowire array 500, and FIG. 5C is a schematic circuit diagram 501 of the exemplary in-plane racetrack nanowire array 500. The array 500 implements an extended common reference electrode for an entire array of iRTM nanowire elements, where the extended reference electrode is made up of a series of alternating domains that can be shifted across the readout tunnel barriers so as to provide a self-referencing readout signal. As described further herein, FIGS. 5A-5C implement a common reference layer similar to FIGS. 4A-4C, but with reference layer configured as a domain-wall shift element in itself. The array 500 includes a number of in-plane nanowires, collectively illustrated as nanowires 505. As described herein, the nanowires (tracks) 505 may be magnetized in small domains or sections 506 in one direction or another. MTJ elements collectively shown as MTJ elements 515 are disposed to contact each nanowire separately through a tunnel barrier and are configured to read signals from the nanowires 505 as current is passed through the nanowires 505 and the domains 506 are shifted. In exemplary embodiments, the MTJ elements 515 include a single MTJ 516 (e.g., with MgOx tunnel barrier) for each of the nanowires 505. An alternating-polarization magnetic nanowire (reference magnetic layer) 518 is disposed on and common to MTJs 516 to provide a reference for reading the signals from the nanowires 505.

In exemplary embodiments, the array 500 further includes a readout transistor 520 for reading the nanowires 505, and connected to the nanowires 505 via a conductor 521, which is connected to the reference nanowire 518. Transistor 522 is connected to reference nanowire 518 through a conductor 523, and is used for shifting the domains along the reference nanowire. The array 500 further includes a first set of shift transistors 525 shown as a single transistor for illustrative purposes, and connected to the nanowires 505 via a conductor set 526. The array 500 also includes a second set of shift transistors 530, which are also used in the read operation. The shift transistors 530 are connected to the nanowires 505 via a set of conductors 531. It will be appreciated that the shift transistor 525 can be either a single transistor or multiple transistors, on per nanowire storage element. The array also includes a spin-torque-transfer MTJ element 540 for performing injection operations as needed for the reference nanowire to be set with alternating polarization domains, but other methods of injection can be used, such as field-generating wires, as further described herein.

As such, FIGS. 5A-5C illustrate the implementation of a common reference layer similar to FIGS. 4A-4C, but with reference layer configured as a domain-wall shift element in itself. Operation is similar to that of FIGS. 4A-4C, except that an additional transistor 540 is used for injection of alternating polarity domains into the reference layer wire, and transistors 520 and 522 are configured to shift these domains across the end of the nanowire array 505. As described herein, FIGS. 5A-5C depict a spin-torque-transfer element for performing this injection operation, but other methods of injection can be used, such as field-generating wires. In addition, the injection mechanism for the individual racetrack nanowires 505 is omitted for clarity, and can be the same as implemented conventionally. The operation of the array 500 of FIGS. 5A-5C includes two read steps. A first MTJ of the MTJs 516 is chosen and read by activating read transistor 520 and one of the shift transistors 530 to ground. Sneak paths can be eliminated as in FIGS. 4A-4C by adding transistors 525 to the array 500, at the cost of lower memory density. After reading the resistance of the nanowire-tunnel barrier-reference layer stack 515, the reference layer 518 is then shifted by a single domain width to present the opposite polarity domain at the reference side of the MTJs 516. The resistance of the MTJ 516 is then read and compared with the first reading. A change in resistance from low to high indicates a polarization of the racetrack nanowire domain opposite that which would give a resistance change from high to low. This type of operation can be referred to as "self-referencing" in that the MTJ resistance need not be compared with a separate reference resistance external to the array 500. The measurement focuses on which direction the resistance changes as the reference wire shifts domain polarity above the MTJ 516. Such operation can be quite beneficial in instances where there are variances in MTJ resistance and it is difficult to create an external reference resistance that is suitable for use in comparing against every one of the MTJs 516, which is often the situation when making extremely small MTJs 516, such as those which would be formed atop very narrow racetrack nanowires.

In exemplary embodiments, several fabrication techniques are possible to fabricate the exemplary racetrack devices described herein. The following figures and description are illustrative fabrication examples. It will be appreciated that other fabrication techniques are contemplated in other exemplary embodiments.

Figure 6:
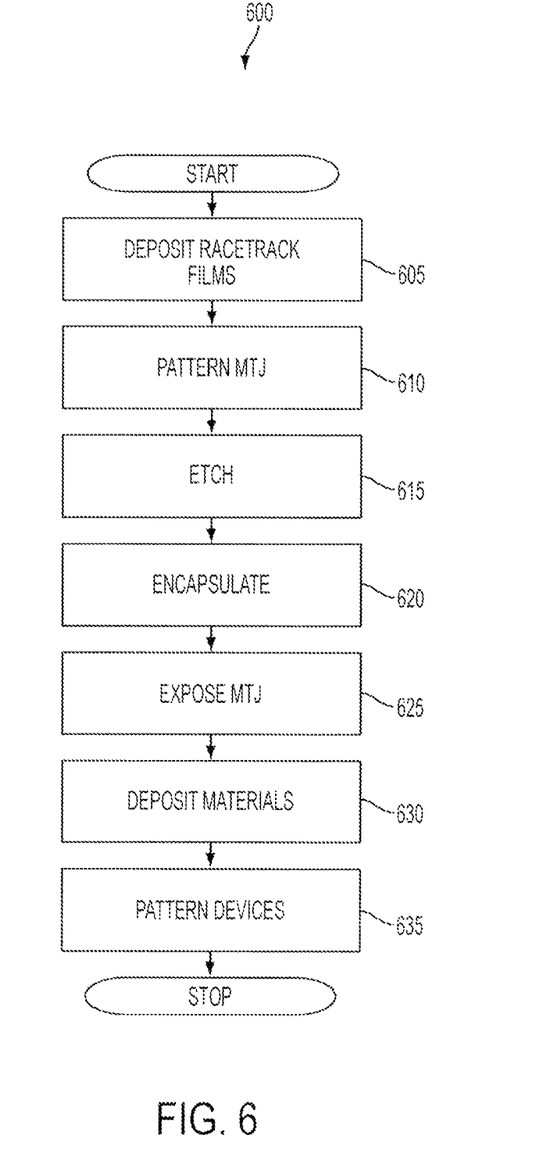
FIG. 6 illustrates a flowchart for an exemplary racetrack device fabrication method.
Figure 7A:
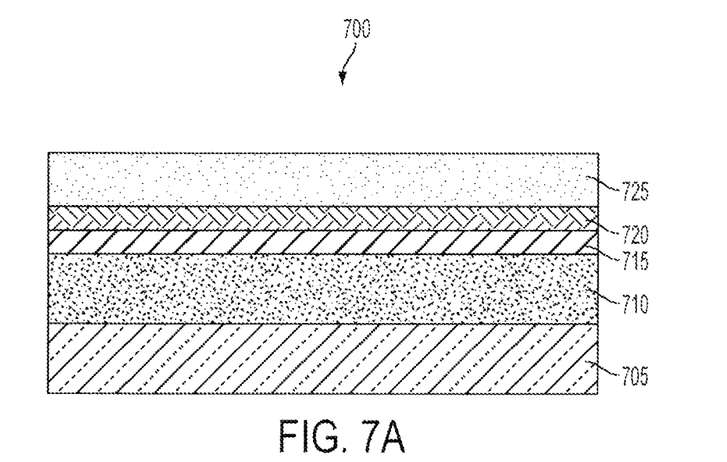
FIG. 7A illustrates an intermediate structure for a racetrack device.

FIG. 6 illustrates a flowchart for a racetrack device fabrication method 600. FIG. 7A illustrates an intermediate structure 700 for the racetrack device. At block 605, racetrack films are deposited onto a substrate 705 (e.g., silicon (Si)). The racetrack films include a conventional complementary metal-oxide-semiconductor (CMOS) layer 710, which includes interconnects, onto which first racetrack magnetic films 715 (i.e., for nanowires) are deposited. The racetrack films further include a tunnel barrier layer 720 deposited on the first racetrack magnetic films 715, and a reference layer 725 deposited onto the tunnel barrier layer 720. In exemplary embodiments, the reference layer 725 includes as necessary any non-magnetic films for etch masking, such as a metal like aluminum (Al) or a dielectric film like silicon oxide ($SiO_2$) or silicon nitride (SiN). It will be appreciated that the etch steps described herein include gentle etch techniques, such as chemical wet etching and plasma etching, to remove mask layers and expose racetrack elements. In other exemplary embodiments, atomic layer etching techniques can be implemented to expose desired layer of magnetics without damage to the magnetics.

Figure 7B:
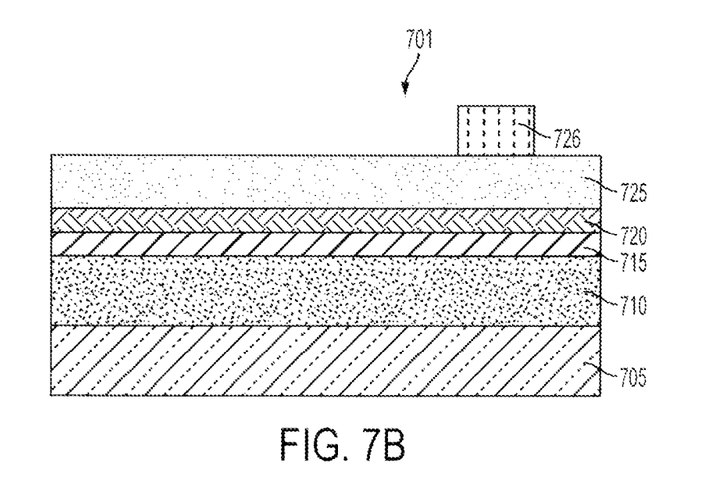
FIG. 7B illustrates an intermediate structure for a racetrack device.

At block 610, standard photolithography is implemented to form a photoresist pattern 726 on the reference layer 725. FIG. 7B illustrates an intermediate structure 701 for the racetrack device. In exemplary embodiments, the photoresist pattern 726, and an antireflective coating as needed, are formed for patterning the MTJ.

Figure 7C:
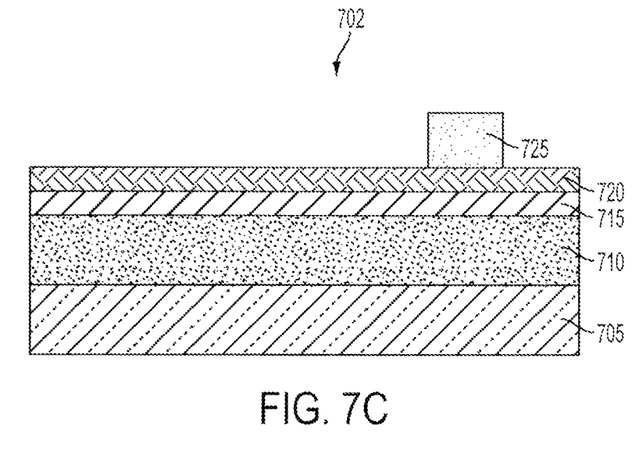
FIG. 7C illustrates an intermediate structure for a racetrack device.

At block 615, standard etching techniques are implemented to etch the reference layer 725 to the tunnel barrier layer 720. FIG. 7C illustrates an intermediate structure 702 for the racetrack device, showing the reference layer 725 etched to pattern a dimension of MTJ. The reference layer 725 is etched in the shape of a line into the page, and would span the extent of a particular array. MTJ elements will be patterned in the perpendicular direction by etching through 725 with a different photoresist pattern to be described below.

Figure 7D:
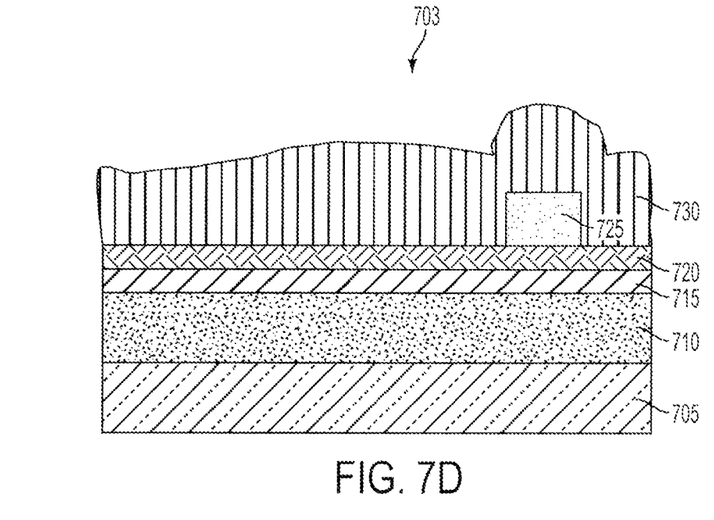
FIG. 7D illustrates an intermediate structure for a racetrack device.

At block 620, dielectric encapsulation is deposited over the exposed tunnel barrier layer 720, and the patterned reference layer 725. FIG. 7D illustrates an intermediate structure 703 for the racetrack device.

Figure 7E:
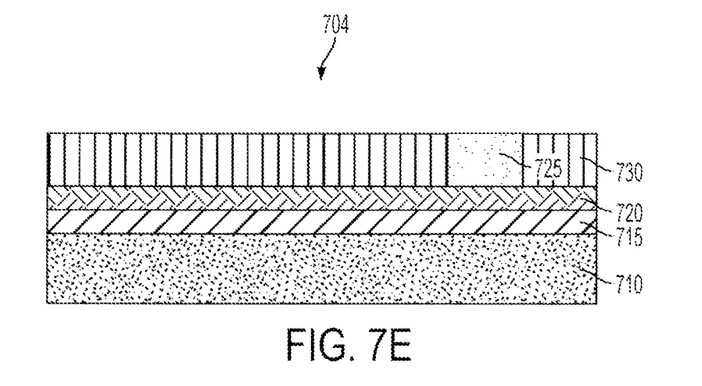
FIG. 7E illustrates an intermediate structure for a racetrack device.

At block 625, the intermediate structure 703 is polished to expose the reference layer 725 through the dielectric encapsulation 730. In exemplary embodiments, chemical mechanical polishing/planarization (CMP) can be implemented. CMP is a process of smoothing surfaces with the combination of chemical and mechanical forces, using both chemical etching and free abrasive polishing. FIG. 7E illustrates an intermediate structure 704 for the racetrack device.

Figure 7F:
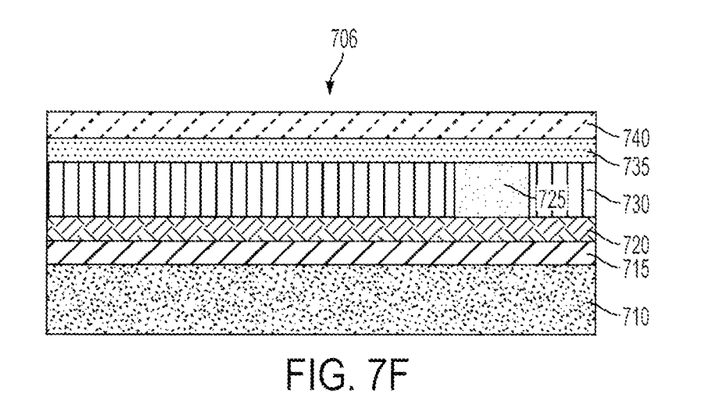
FIG. 7F illustrates an intermediate structure for a racetrack device.

At block 630, additional racetrack films are deposited on the intermediate device 704. The racetrack films include a top tunnel barrier layer 735 that is deposited on the dielectric encapsulation 730 and the reference layer 725, and racetrack magnetic films 740 that are deposited on the top tunnel barrier layer 735. In exemplary embodiments, prior to the deposition of the additional racetrack films, an in situ pre-clean etch can be performed. FIG. 7F illustrates an intermediate structure 706 for the racetrack device.

Figure 7G:
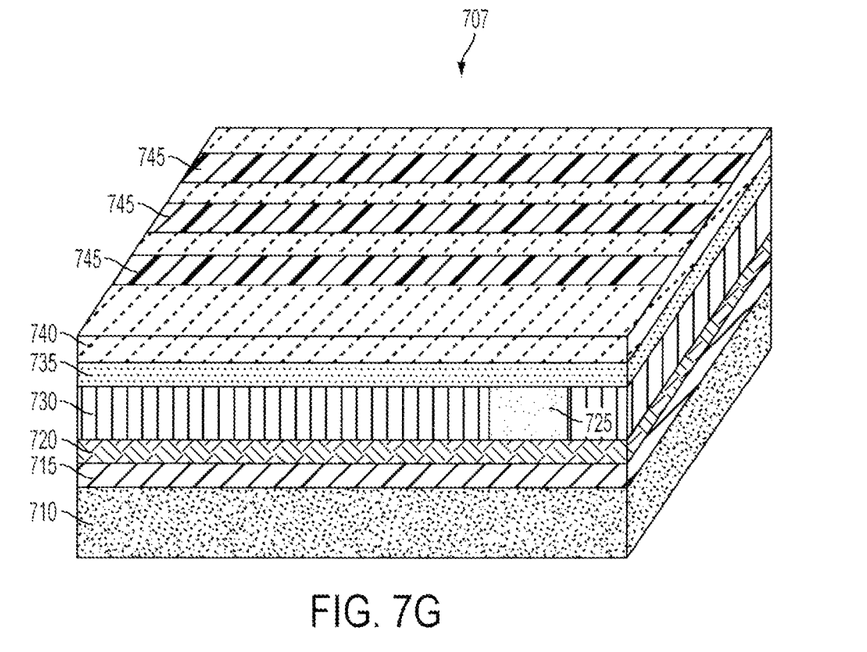
FIG. 7G illustrates an intermediate structure for a racetrack device.

At block 635, individual racetrack storage nanowire devices and readout MTJs are patterned. FIG. 7G illustrates an intermediate structure 707 for the racetrack device. In exemplary embodiments, standard photolithography techniques are implemented to form resist patterns 745 that define the individual devices as described herein. Standard etching techniques are then implemented to etch to both racetrack levels down to the CMOS layer 710. In exemplary embodiments, connection from the CMOS layer 710 to the bottom racetrack (i.e., racetrack magnetic layer 715) can be made with a metallic via or wire (e.g., a direct or indirect connection). In addition, connection to the top racetrack (i.e., the racetrack magnetic layer 740) can be made through a via chain external to and around the structure, coming down to contact the top, or it can be made through a large or short-circuited (low-resistance) MTJ from the top racetrack down to an island of bottom racetrack, and then to a metallic via or wire.

Figure 8:
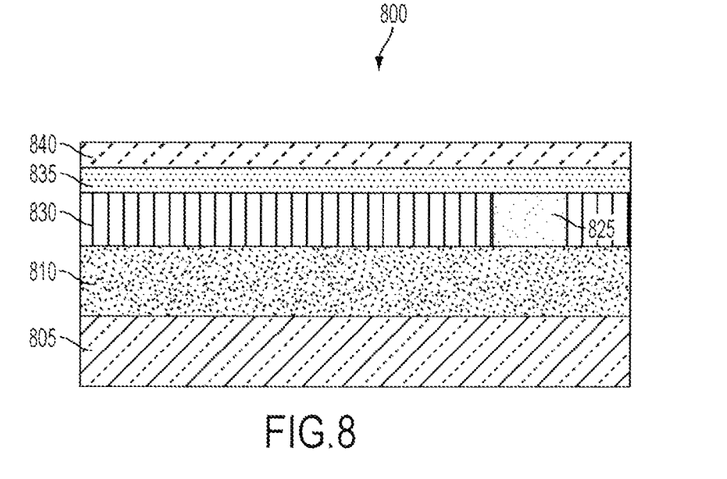
FIG. 8 is an intermediate structure of the in-plane racetrack nanowire array of FIGS. 4A-4C.

Referring again to FIGS. 4A-4C in which the fixed direction magnet (reference magnetic layer) 418 is disposed on and common to MTJs 416 for reading the signals from the nanowires 405, the fabrication method 600 of FIG. 6 can be modified skip the disposition of the first racetrack films, and depositing the reference layer 418 directly on the aforementioned CMOS layer. FIG. 8 is an intermediate structure 800 of the in-plane racetrack nanowire array 400 of FIGS. 4A-4C. A CMOS layer 810 is fabricated on a substrate 805 (e.g., Si). A common reference layer 825 is deposited and patterned on the CMOS layer 810 with a process similar to that described with respect to FIG. 6. A dielectric encapsulation 830 is deposited on the CMOS layer and reference layer 825, and subsequently polished to expose the reference layer 825. Racetrack films including an MTJ layer 835 and a racetrack magnetic film 840 are then deposited on the dielectric encapsulation 830 and the reference layer 825. Subsequent patterning is used to create individual racetrack storage nanowire elements perpendicular to the common reference layer 825. Etching of these racetrack storage elements is stopped on the MTJ barrier or the reference layer 825. In exemplary embodiments, damascene formation of the common readout wire can be implemented with a trench in the dielectric encapsulation 830, and then filled with metal and polished, or can be performed with metal deposition, followed by a metal etch, then dielectric deposition and dielectric polish. In addition, an in-situ pre-clean is performed prior to the deposition of the MTJ layer 835 and racetrack magnetic film 840. The array 500 of FIGS. 5A-5C can be fabricated with similar techniques.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a memory device, comprising:
depositing and forming a common reference layer on a first racetrack film, the first racetrack film comprising a first racetrack magnetic film deposited on a complementary metal on oxide (CMOS) layer fabricated on a substrate, and a first magnetic tunnel junction (MTJ) barrier layer deposited on the first racetrack magnetic film layer;
depositing a dielectric encapsulation on the reference layer;
depositing a second racetrack film on the dielectric encapsulation, the second racetrack film comprising a second MTJ barrier layer deposited on the reference layer and a second racetrack magnetic film layer deposited on the second MTJ barrier layer; and
exposing the reference layer to couple the second racetrack film to the reference layer.

2. The method of claim 1, wherein the first and second MTJ barrier layers are magnesium oxide ($MgO_x$).

3. The method of claim 1, wherein the reference layer is a fixed direction magnet.

4. The method of claim 1, further comprising polishing the dielectric encapsulation.

* * * * *